(12) United States Patent
Lojek

(10) Patent No.: US 7,170,128 B2
(45) Date of Patent: Jan. 30, 2007

(54) MULTI-BIT NANOCRYSTAL MEMORY

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/001,936

(22) Filed: Dec. 2, 2004

(65) Prior Publication Data

US 2006/0121673 A1    Jun. 8, 2006

(51) Int. Cl.
*H01L 29/76* (2006.01)
(52) U.S. Cl. .................. 257/314; 438/257
(58) Field of Classification Search ......... 257/314, 257/315, 316, 319, 324; 438/257, 259, 260, 438/264
See application file for complete search history.

(56) References Cited

U.S. PATENT DOCUMENTS

| | | | |
|---|---|---|---|
| 5,278,439 A | 1/1994 | Ma et al. | 257/319 |
| 5,654,917 A | 8/1997 | Ogura et al. | 365/185.18 |
| 6,165,842 A | 12/2000 | Shin et al. | 438/257 |
| 6,686,632 B2 | 2/2004 | Ogura et al. | 257/374 |
| 6,913,984 B2 * | 7/2005 | Kim et al. | 438/432 |
| 6,949,788 B2 * | 9/2005 | Fujiwara et al. | 257/314 |
| 2004/0130941 A1 | 7/2004 | Kan et al. | 365/177 |

* cited by examiner

*Primary Examiner*—Phuc T. Dang
(74) *Attorney, Agent, or Firm*—Schneck & Schneck; Thomas Schneck

(57) ABSTRACT

An improved memory cell having a pair of non-volatile memory transistors with each transistor using a nanocrystal gate structure, the transistor pair constructed between a pair of bit line polysilicon depositions. Between the pair of non-volatile memory transistors, a word line device is interposed, allowing serial linkage of the pair of non-volatile memory transistors.

18 Claims, 11 Drawing Sheets

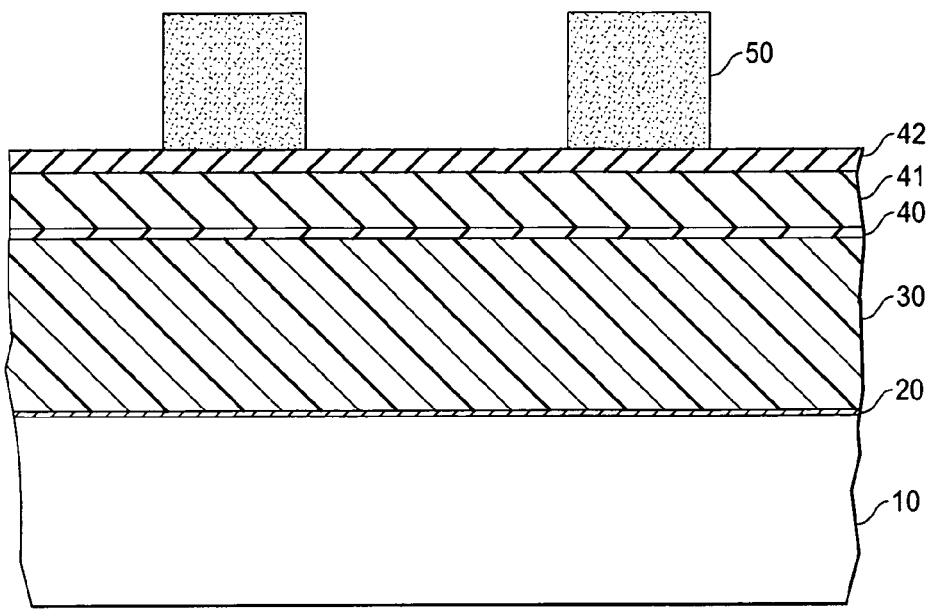
Fig._ 1a
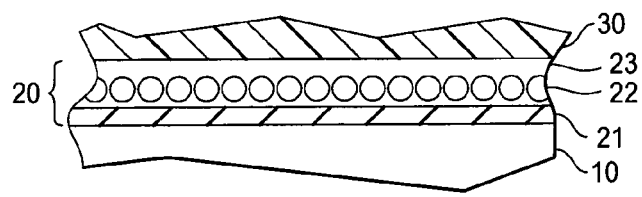
Fig._ 1b
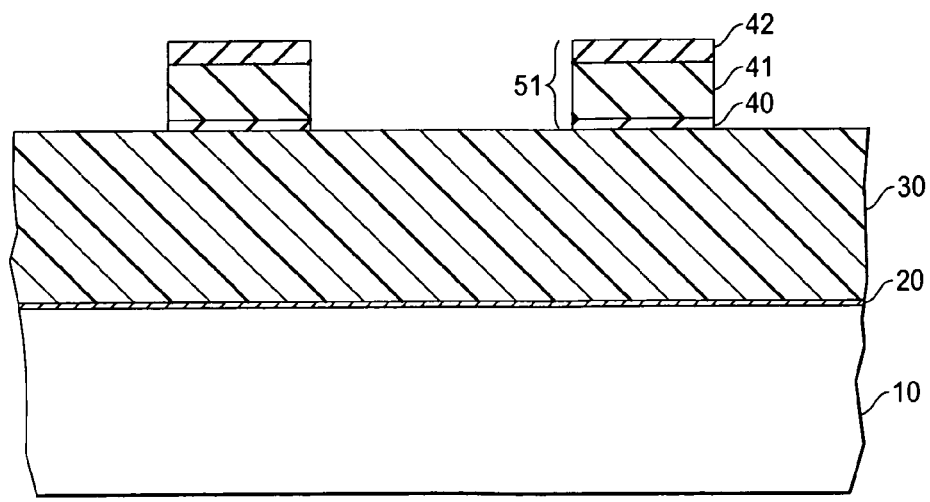
Fig._ 2

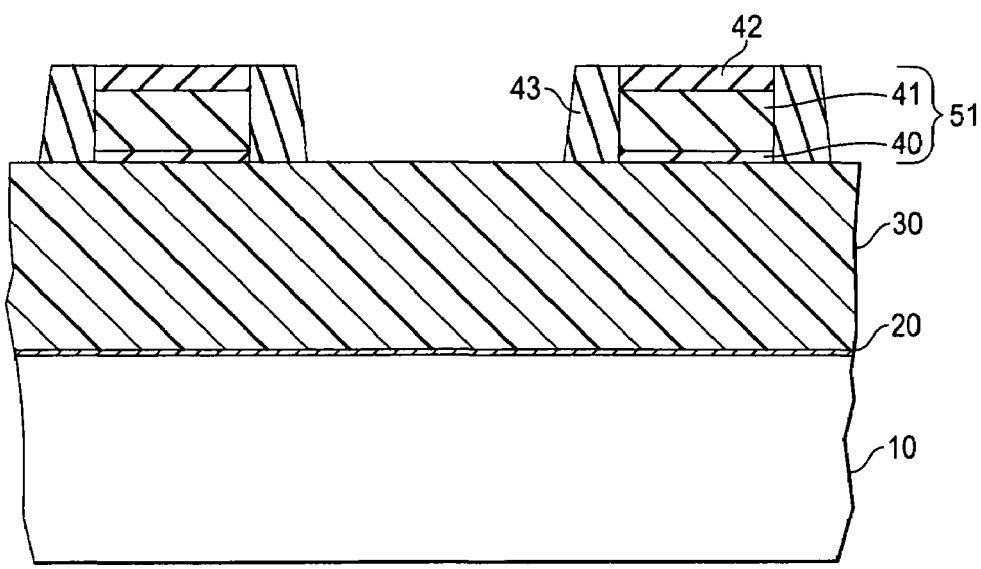
Fig. _ 3
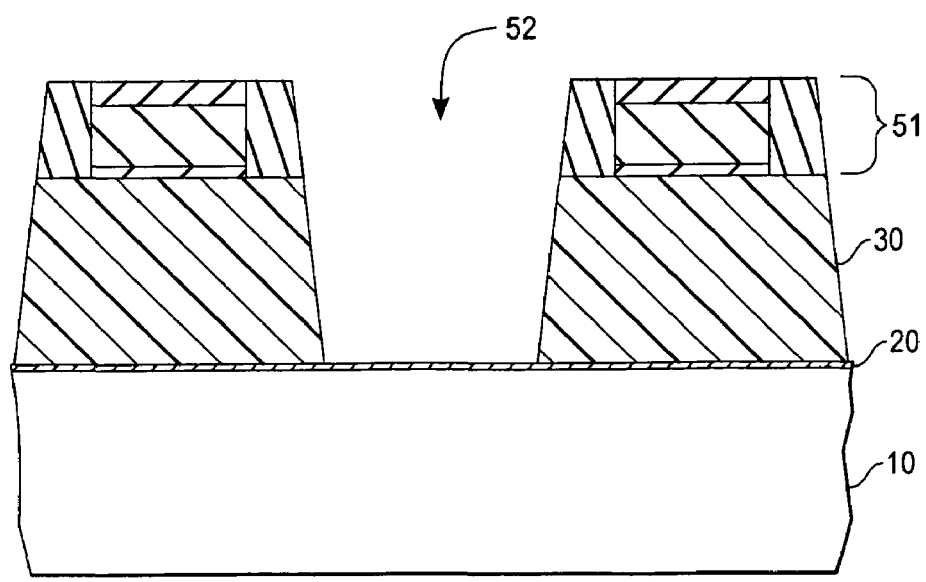
Fig. _ 4

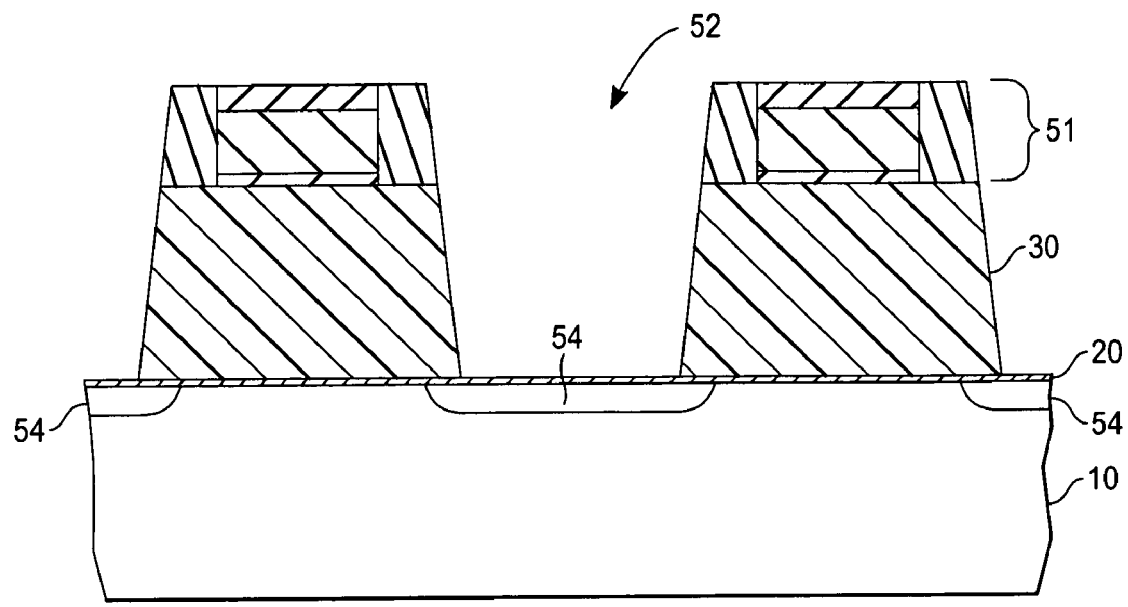
Fig. _ 5
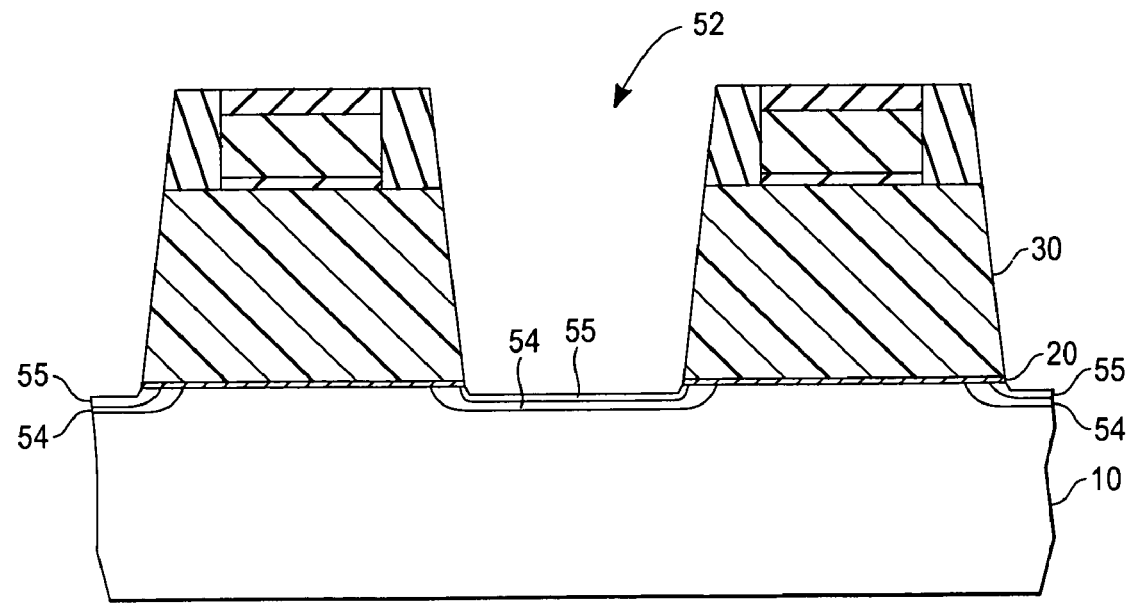
Fig. _ 6

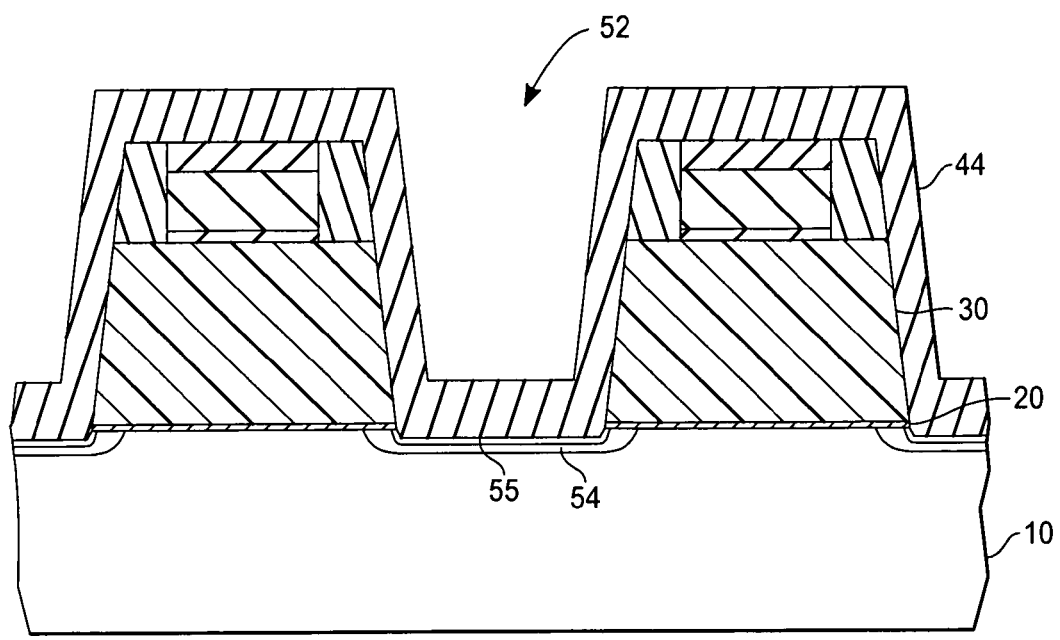
Fig. _ 7
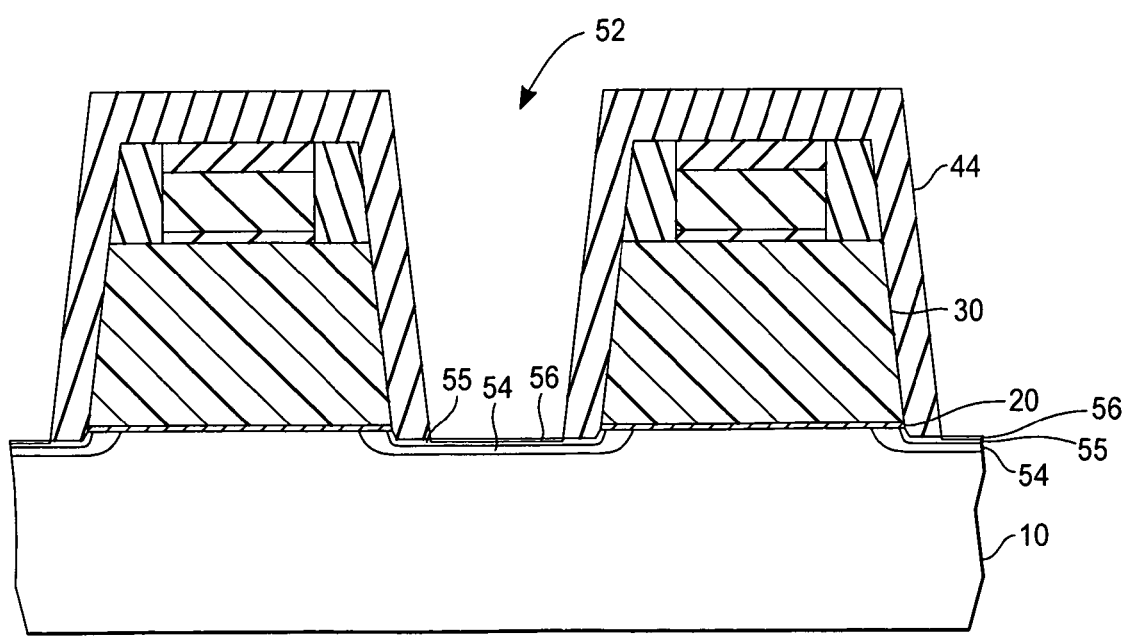
Fig. _ 8

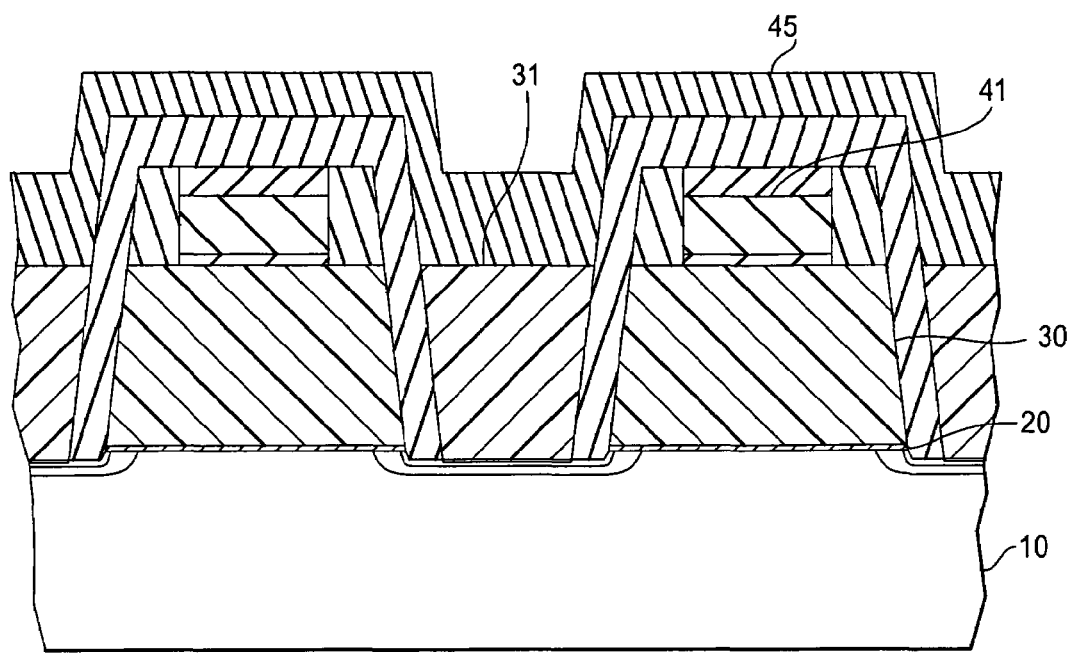
Fig._11
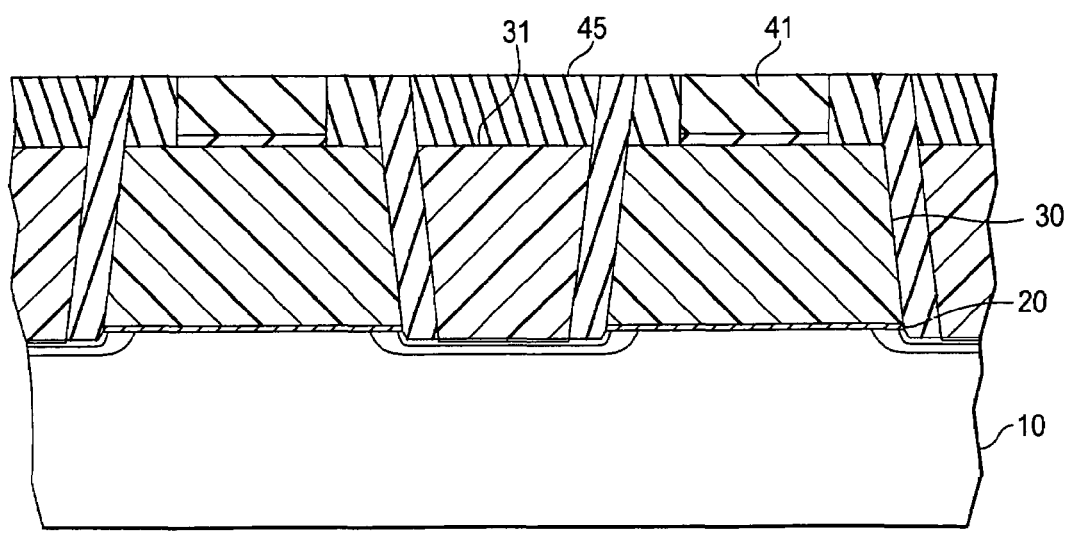
Fig._12

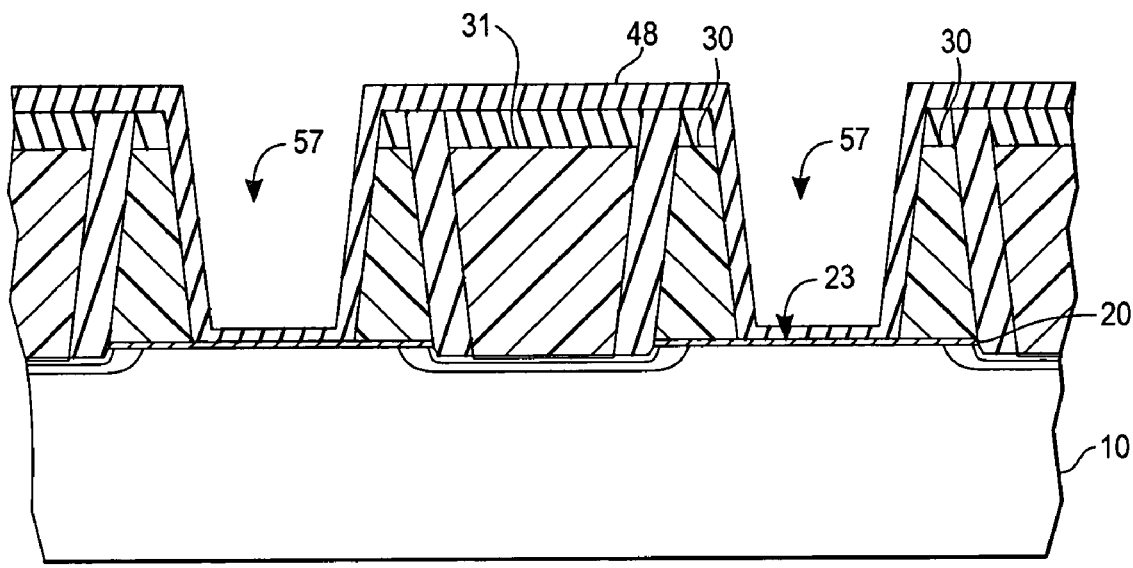
Fig. _ 15
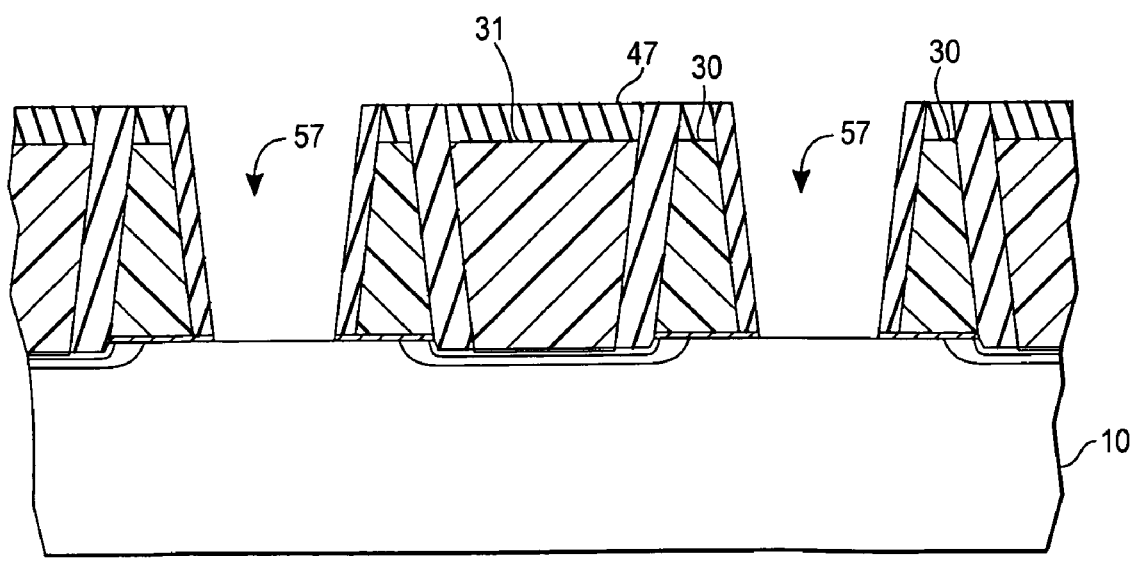
Fig. _ 16

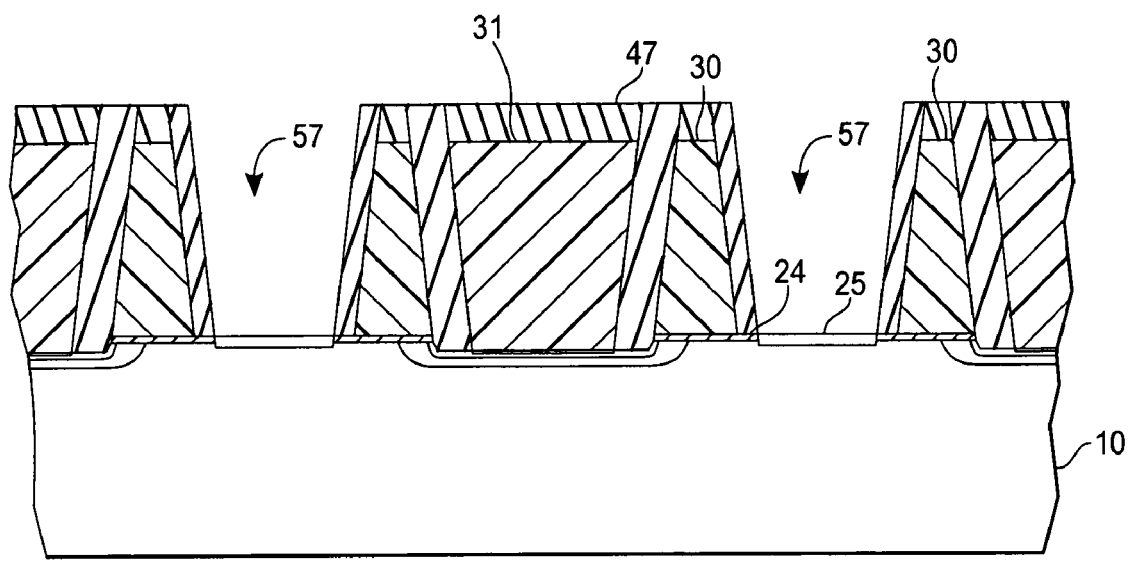
Fig._17
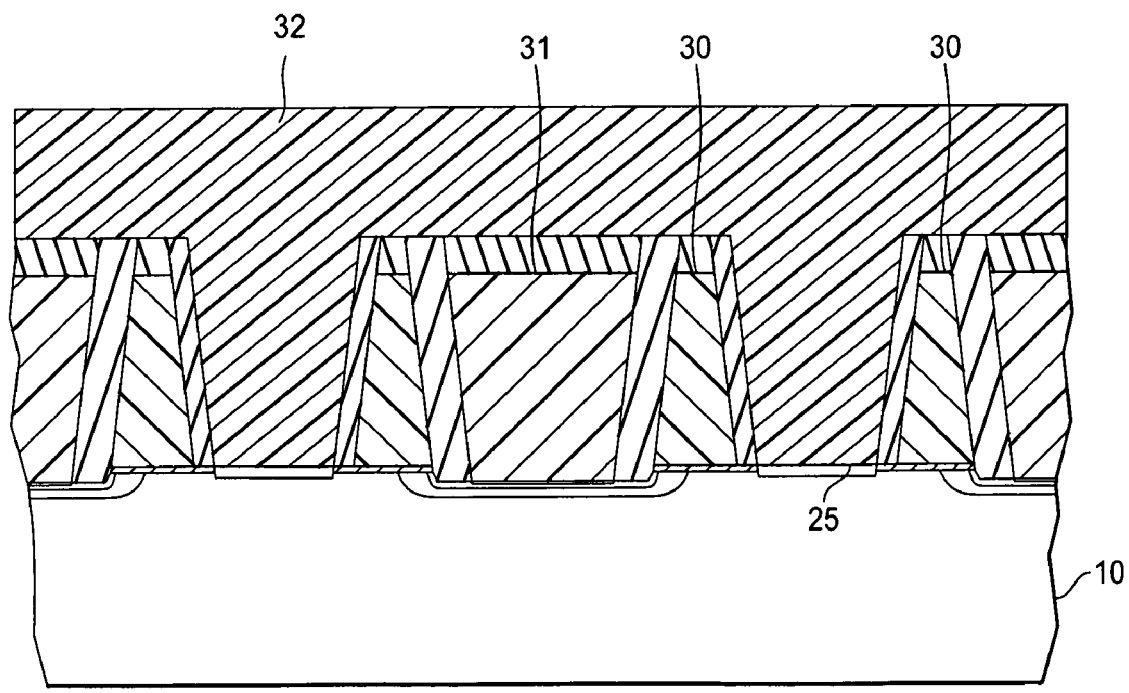
Fig._18

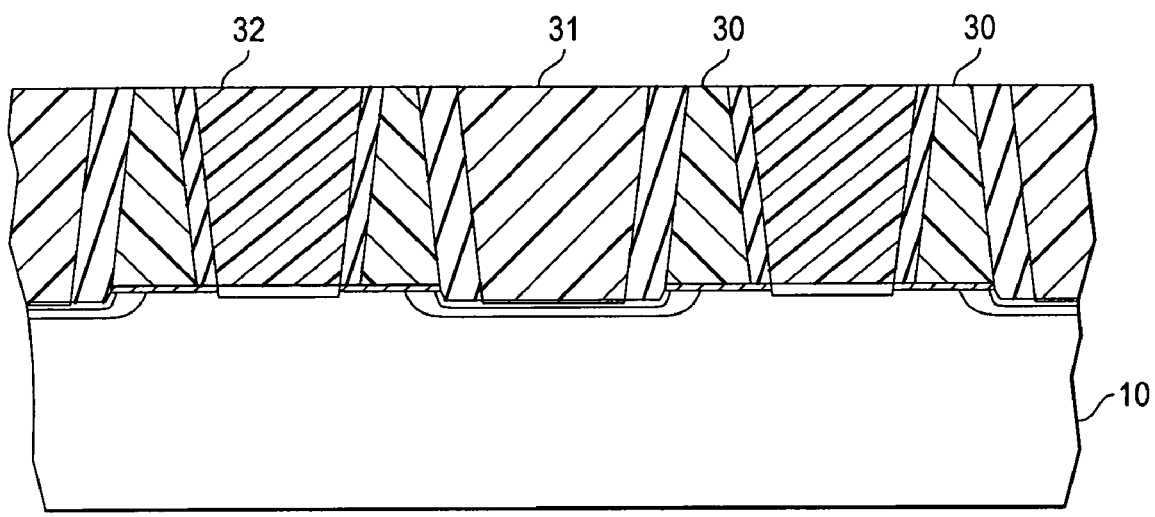
Fig._19
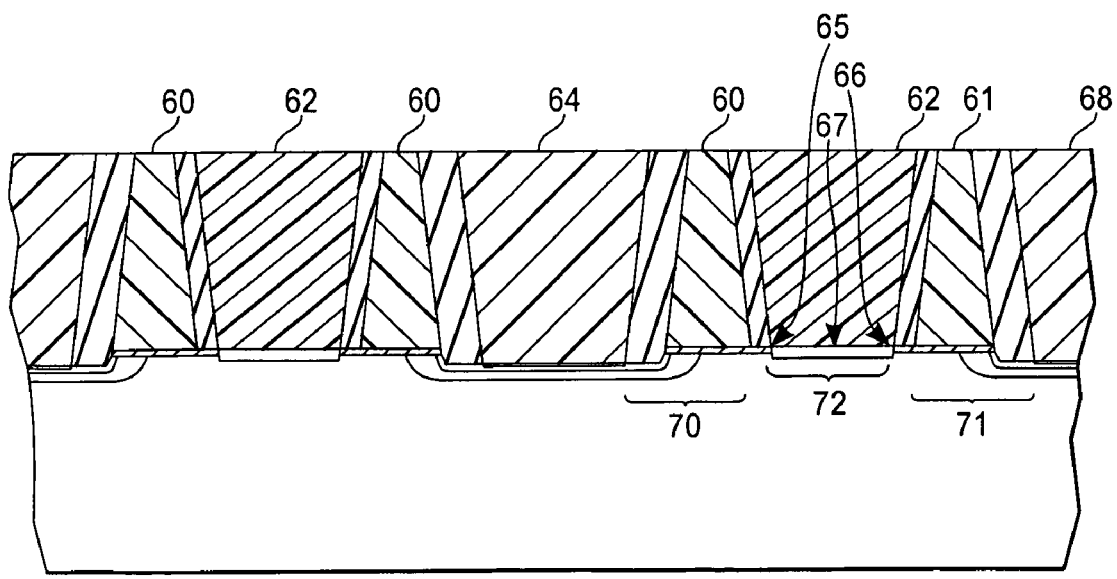
Fig._20

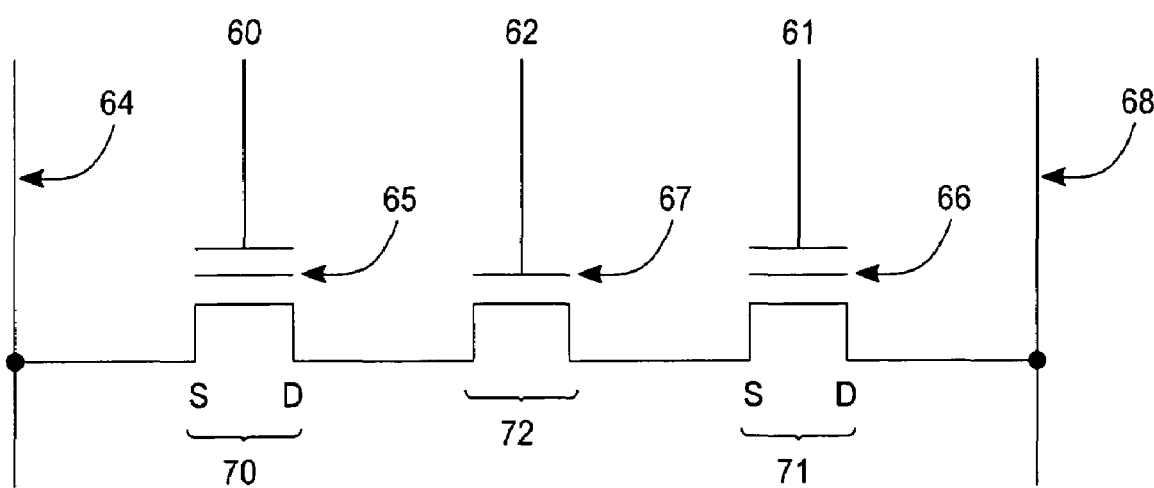
Fig._21

MULTI-BIT NANOCRYSTAL MEMORY

TECHNICAL FIELD

The invention relates to non-volatile memory transistor construction, and, more specifically, to a transistor employing nanocrystals.

BACKGROUND ART

Non-volatile memory designs continue to improve with technological advancements. Floating gate and MONOS (metal/polysilicon oxide nitride oxide silicon) are types of nonvolatile memories. In conventional floating gate structures, charge is stored on to a floating gate, by either Fowler-Nordheim tunneling or by source side injection. The cell operation is governed by electron charge storage on an electrically isolated floating gate. The amount of charge stored modulates the memory cell's transistor characteristic. Because the only electrical connection to the floating gate is through capacitors, the memory cell can be thought of as a linear capacitor network with an attached N-channel transistor. Any charge present on the floating gate is retained due to the inherent Si—$SiO_2$ energy barrier height, leading to the non-volatile nature of the memory cell.

MONOS memory cells, in comparison to standard floating gate cells, may have faster program times and higher densities. In MONOS memory cells using sidewall spacer structures, a source side electron injection approach is faster and may require lower voltages than electron tunneling methods used for a standard floating gate design. U.S. Pat. No. 6,686,632, to Ogura et al. describes a dual bit MONOS memory having a twin cell structure. The cell structure is realized by placing sidewall control gates over a composite of oxide nitride oxide (ONO). Both sides of a word gate and control gates are formed using a disposable sidewall process. During construction of this device, a sidewall spacer is required for the word gate to accommodate the ONO and source side injection structure.

Newer processes that may be used in non-volatile memory designs also continue to be developed. For example, metal nanocrystal memories have been utilized to enhance the performance of memory cell devices to improve the work function. In a nanocrystal non-volatile storage device, charge is not stored on a continuous floating gate layer. Instead, a large number of discrete mutually isolated nanocrystals are contained on a semiconductor layer. Nanocrystals may be employed in storing small amounts of electrical charge, even being able to store a single, or a small number, of atoms. In theory, smaller transistors may be made because structures containing nanocrystal charge storage "dots" might be made exceedingly small.

A downside to using nanocrystals has been high power consumption due to refresh requirements, short retention time, and high capacitance. U.S. Pat. No. 6,165,842, to Shin et al. describes a method for fabricating a nonvolatile memory device using crystal dots. A tunneling dielectric, a thin amorphous silicon film, a polysilicon layer having nanocrystals, a dielectric layer, and a polysilicon film are formed. The method develops a nonvolatile memory cell gate structure having dimensions limited by the resolution of optics or photoresist materials used in photolithography and must develop a multitude of layers to support and construct a nanocrystal layer.

Such devices are therefore difficult to manufacture because nanocrystals are many times smaller than photolithography resolution limits currently used in manufacturing integrated circuits.

SUMMARY OF THE INVENTION

The present invention is an improved memory cell device employing nanocrystals to reduce an overall size of each memory cell gate, and therefore reduce the overall integrated circuit or die size of a memory circuit. In accordance with the present invention, a nanocrystal layer is used in the construction of a dual bit nonvolatile memory structure. A plurality of trenches are developed to reduce the gate area of each memory cell which uses a nanocrystal charge storage region. Charge is transferred through a thin tunneling barrier to the nanocrystals. The method forms a memory cell gate using a plurality of offset trenches to expose and remove a portion of a nanocrystal layer to develop a nanocrystal gate area having at least one dimension that is smaller than current photolithography resolution limits.

BRIEF DESCRIPTION OF THE DRAWINGS

FIG. 1A is a cross section of an exemplary beginning structure of a substrate with a nanocrystal stack, and a first polysilicon layer formed above it. Also shown are a formed oxide layer, nitride layer, oxide layer and a patterned photoresist mask.

FIG. 1B is an enlarged cross section al area of the nanocrystal stack of FIG. 1A, comprised of a tunnel oxide layer, a nanocrystal layer, and a control oxide layer.

FIG. 2 is a cross section of FIG. 1A after a portion of the oxide nitride oxide have been removed and the patterned photoresist mask has been removed.

FIG. 3 is a cross section of FIG. 2 after a fifth oxide has been formed on the sidewalls of oxide mesa structures.

FIG. 4 is a cross section of FIG. 3 after an exposed portion of the first polysilicon layer has been selectively removed.

FIG. 5 is a cross section of FIG. 4 after a first dopant has been formed in the underlying substrate.

FIG. 6 is a cross section of FIG. 5 after a portion of the nanocrystal stack has been selectively removed and a second dopant has been selectively formed in the exposed substrate.

FIG. 7 is a cross section of FIG. 6 after a sixth oxide has been formed over the dopant area and mesa structures.

FIG. 8 is a cross section of FIG. 7 after a portion of the sixth oxide has been selectively removed and a third dopant has been selectively formed in the exposed substrate.

FIG. 11 is a cross section of FIG. 10 after a fifth oxide layer has been formed.

FIG. 12 is a cross section of FIG. 11 after a portion of the seventh oxide layer has been selectively removed.

FIG. 15 is a cross section of FIG. 14 after an eighth oxide layer has been deposited.

FIG. 16 is a cross section of FIG. 15 after a portion of the eighth oxide layer and the nanocrystal stack has been removed.

FIG. 17 is a cross section of FIG. 16 after a word line gate oxide has been formed above the exposed substrate.

FIG. 18 is a cross section of FIG. 17 after a third polysilicon layer has been deposited.

FIG. 19 is a cross section of FIG. 18 after a portion of the third polysilicon layer and top oxide have been removed.

FIG. 20 is a cross section of the memory cell structures indicating various memory cell structure elements.

FIG. 21 is a circuit diagram of a dual memory cell as shown in FIG. 20.

DETAILED DESCRIPTION OF THE INVENTION

Figure 9:
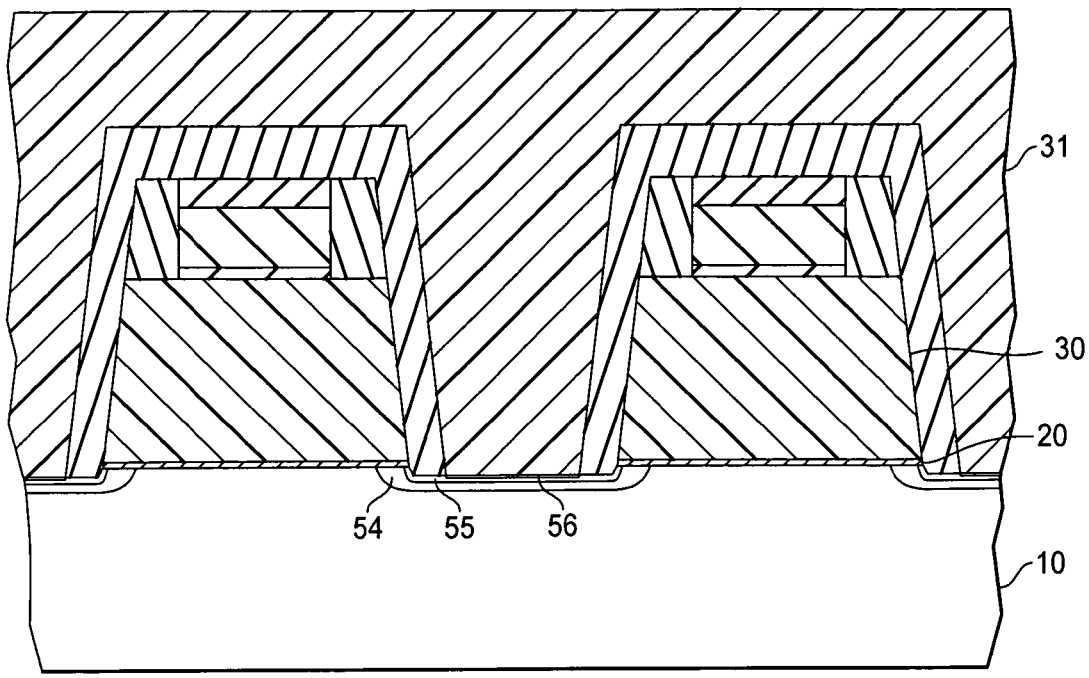
FIG. 9 is a cross section of FIG. 8 after a second polysilicon layer has been formed.

Collectively, individual nanocrystals in a nanocrystal memory gate can control the channel conductivity of a memory cell. Each nanocrystal individually stores a small number of electrons. One of the advantages of a nanocrystal charge storage gate is an ability to use thinner tunnel oxides and shorter channel lengths and therefore, a smaller cell area may be developed. In addition, the stored charge (electrons) in a nanocrystal charge storage gate may be directed to a specific area within the storage gate area and can be configured to store a single logic state (bit) or multiple logic states (bits) within a given cell.

With reference to an exemplary process beginning with FIG. 1A, a substrate 10 having a p-well or p-type substrate material is used. The p-well is developed by doping a surface of the substrate with, for example, boron. A nanocrystal stack 20 is formed above the substrate 10. The nanocrystal stack 20, FIG. 1B, is composed of a thin tunnel oxide layer 21 (a first oxide), a thin nanocrystal layer 22, and a thin control oxide layer 23 (a second oxide). In a specific embodiment, the nanocrystal stack 20 will have an average thickness of approximately 120–180 Angstroms. The tunnel oxide layer 21 may generally have a thickness of 20–50 Angstroms; the nanocrystal layer 22 may generally have a thickness of 20–60 Angstroms; and the control oxide layer 23 may generally have a thickness of 60–100 Angstroms.

The nanocrystals may be comprised of any material such as a silicon, germanium, Si—Ge, or metal, and the nanocrystal layer will typically have an approximate 50% to 75% area coverage of nanocrystals. In a specific embodiment, the nanocrystal area coverage will be approximately 60%. The nanocrystal layer 22 may be fabricated by various techniques, including chemical vapor deposition, low energy implantation, or by aerosol formation.

With reference again to FIG. 1A, in the formation of a memory cell structure, a first polysilicon layer 30 is formed over the nanocrystal stack 20 (tunnel oxide 21, nanocrystal 22, and control oxide 23 layers). Above the first polysilicon layer 30, a third oxide layer 40, a nitride layer 41, and a fourth oxide layer 42 are formed. Referring to FIG. 2, a portion of the fourth oxide layer 42, nitride layer 41, and third oxide layer 40 are then selectively removed, for example, using a patterned photoresist mask 50 and an etch process. After the patterned photoresist mask 50 is removed, a sacrificial mesa (or island) structure 51 remains, composed of portions of the third oxide layer 40, nitride layer 41, and the fourth oxide 42.

In reference to FIG. 3, a fifth oxide layer 43 is formed over the exposed edges or sidewalls of the sacrificial mesa structure 51, for example using a chemical vapor deposition of oxide followed by, for example, patterning and an anisotropic etch process, leaving a fifth oxide layer 43 on both sides of the sacrificial mesa structure 51 and over the top portion of the mesa structure, depending upon the deposition process used. The fifth oxide layer 43 will be used as a hard mask during a subsequent removal or etch process. Next, a portion of the underlying first polysilicon layer 30 is removed, for example by a selective etch process. The removal or etch process selectively removes a portion of the first polysilicon layer 30 and forms a first trench 52 in the first polysilicon layer 30 as shown in FIG. 4.

Next, several steps will be used to develop channel, source, and drain areas for a dual cell memory structure. With reference to FIG. 5, a first n-type doped area 54 is formed in the substrate 10, for example by high angle tilt ion implantation, approximately near the bottom of the first trench 52 or approximately in an area where the nanocrystal stack 20 is exposed. The mesa structure 51 and the first trench 52 will be used as a self-aligning mask and may affect the shape and depth of the first doped area 54 under the nanocrystal stack 20. The first doped area 54 extends partially under the remaining first polysilicon layer 30 and nanocrystal stack 20.

Next, referring to FIG. 6, the exposed portion of the nanocrystal stack 20 in the first trench 52 is removed. In an alternative embodiment, an underlying portion of the substrate 10 may be over-etched to form a depression in the first doped area 54. A second doped area 55 is formed in the area proximate to the first doped area 54. Referring to FIG. 7, a sixth oxide layer 44 is formed over the previously described structures and subsequently etched to expose the second doped area 55 approximately at the bottom of the first trench 52. A third doped area 56 is then formed in the substrate 10 near the bottom of the first trench 52 as shown in FIG. 8.

Figure 10:
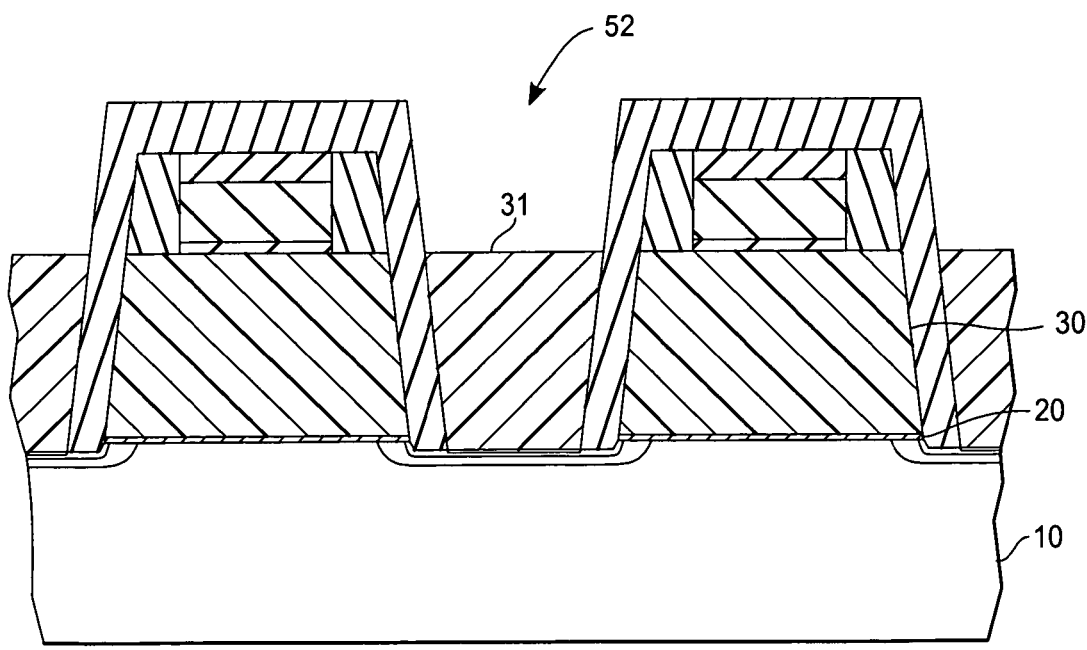
FIG. 10 is a cross section of FIG. 9 after a portion of the second polysilicon layer has been selectively removed.

Referring to FIG. 9, a second polysilicon layer 31 is then formed over the doped areas 54, 55, 56 of the substrate 10 and mesa structures 51, filling the first trench 52. Next, an upper portion of the second polysilicon layer 31 is then selectively removed, leaving a portion of the first trench 52 filled with a portion of the second polysilicon layer 31 as shown in FIG. 10. Next, referring to FIG. 11, a seventh oxide layer 45 is formed, such as a TEOS oxide layer, covering the above described structures and features. A portion of the seventh oxide layer 45 is subsequently removed. A CMP (chemical mechanical planarization) step may be performed to remove a portion of the seventh oxide 45. An exemplary CMP step may also be performed to remove a portion of the seventh oxide layer 45. A portion of the nitride layer 41 under the seventh oxide layer has been exposed as shown in FIG. 12.

Figure 13:
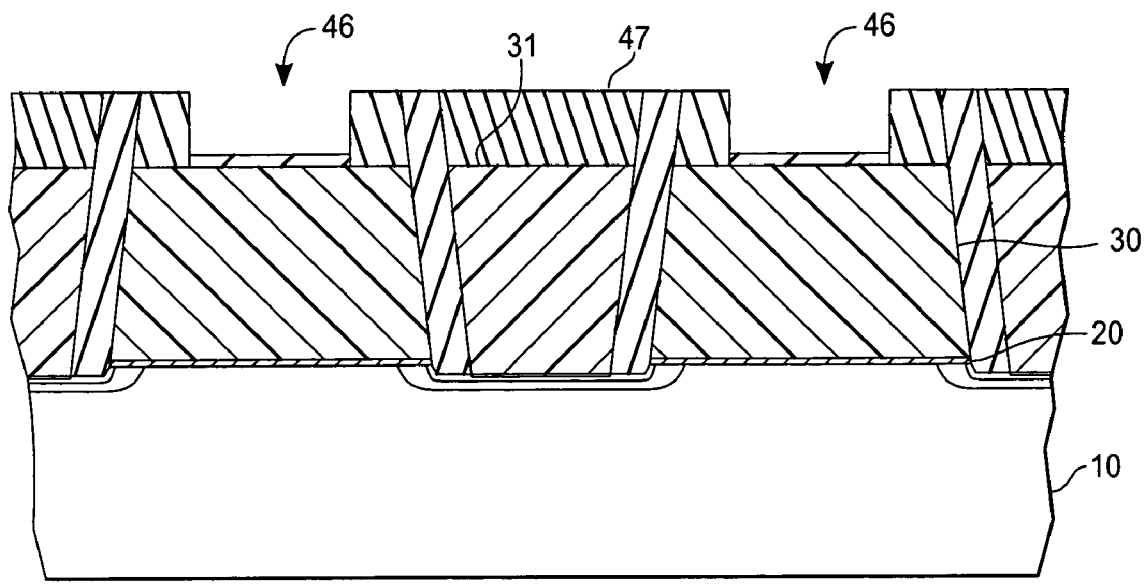
FIG. 13 is a cross section of FIG. 12 after the nitride structure has been removed.
Figure 14:
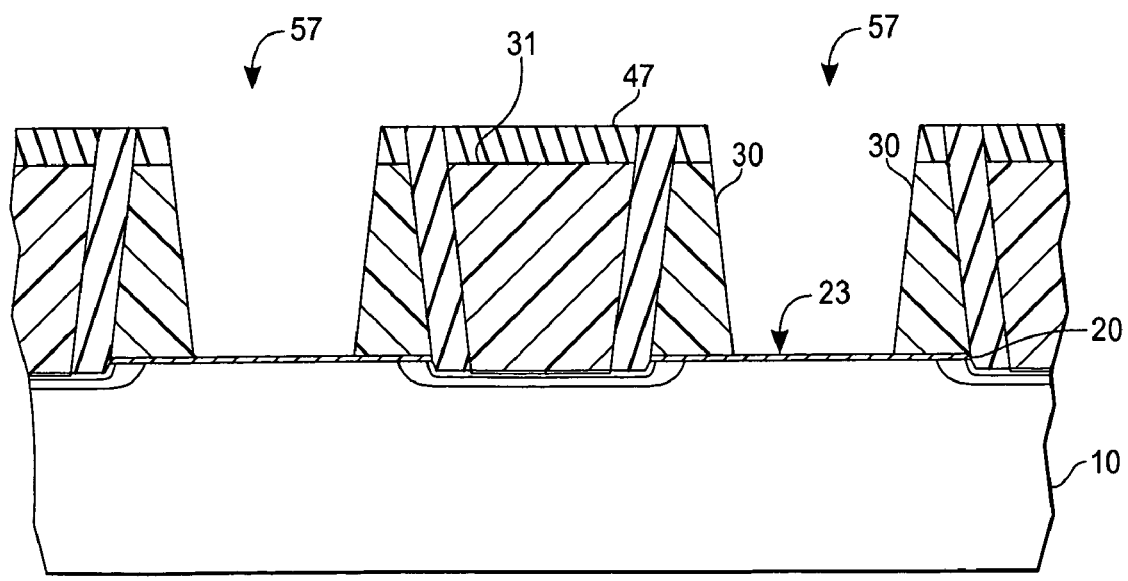
FIG. 14 is a cross section of FIG. 13 after a portion of the remaining oxide layers and a portion of the second polysilicon layer have been selectively removed.

Next, with reference to FIG. 13, the remaining portion of the nitride layer 41 feature is removed, for example by using a high selectivity wet etch technique. Removal of the remaining nitride layer 41 provides breaks 46 in the remaining oxide layer 47. Referring to FIG. 14, a portion of the remaining oxide layer 47 is removed, and a portion of the first polysilicon layer 30 is also removed, forming second trenches 57 in the first polysilicon layer 30. In one embodiment, the second trench is offset from the first trench location by a distance that is smaller than a photolithography resolution limit in an optical process. The underlying control oxide 23 (see FIG. 1B) in the nanocrystal stack 20 may be used as an etch stop for the polysilicon etch.

Referring to FIG. 15, an eighth oxide 48 is formed over the sidewalls of the remaining first polysilicon layer, and the control oxide layer 23 of the nanocrystal stack 20. In one embodiment, the eighth oxide 48 may be formed by a chemical vapor deposition process. Next, with reference to FIG. 16, the eighth oxide 48 at the bottom of the second trench is selectively removed. The removal process also removes a portion of the thin control oxide layer 23 in the nanocrystal stack 20, for example using an etch process, to expose the nanocrystal layer 22. The exposed portion of the nanocrystal layer 22 is removed to expose the underlying tunnel oxide 21 and, the exposed tunnel oxide 21 is also removed.

With reference to FIG. 17, a gate structure 24 for a nonvolatile memory cell has now been formed. Using a nanocrystal gate structure provides an advantage of using thinner tunnel oxides without sacrificing breakdown and leakage parameters, allowing lower operating voltages and/or increasing operating speed. When hot carriers are injected into the nanocrystal layer 22 (FIG. 1B), there is less carrier scattering, in the depleted layer underneath the gate and less energy is required to move carriers into the nanocrystals in the nanocrystal layer 22. Using nanocrystals within the gate structure 24 also allows the use of shorter channel lengths and therefore smaller cell sizes. In the formation process, removing portions of the nanocrystal stack 20 using a two-trench approach allows a nanocrystal gate structure to be built having dimensions that are smaller compared to developing a gate directly from a photoresist mask using a standard photolithography process. Applying a two-trench formation method provides a process to build smaller structures and to reap the technological advantages and improvements that nanocrystal containing structures have to offer.

Next, a cleaning operation may be performed to prepare the wafer surface for a subsequent oxidation step. With continued reference to FIG. 17, a gate oxidation step forms a word line gate structure 25. In FIG. 18, after a word line gate structure 25 has been formed, a third polysilicon layer 32 is formed, filling the second trenches 57. The third polysilicon layer 32 will provide a conductive path for a conventional word line control device. Referring to FIG. 19, a portion of the third polysilicon layer 32 and an upper portion of the remaining oxide layer 48 is then removed, exposing remaining portions of the first polysilicon layer 30 and the second polysilicon layer 31. For example, a chemical mechanical planarization step may be performed, and a cleaning process may be used to prepare the wafer surface for forming additional polysilicon or metal interconnections. The exposed portions of the first 30, second 31, and third 32 polysilicon layers provide conductive paths to the underlying structures. The exposed polysilicon 30, 31, 32 will be further developed or coupled to interconnections including a word line, bit line, and/or control gate line. A variety of subsequent processes may be performed to form the conductive interconnections to produce an integrated circuit memory chip.

A basic non-volatile dual memory cell structure of FIG. 20 (without interconnections), is schematically represented in FIG. 21. Two memory cells 70, 71 are serially coupled by a word line device 72 having gate portions 62 and 67. Each memory cell 70, 71 is also coupled to a conductive control gate line 60, 61 and a bit line 61, 68. The drain and source of each memory cell 70, 71, having a nanocrystal area 65, 66 to store electrons, provide the functions for a dual non-volatile memory cell structure.

Presented in this description is an exemplary structure and fabrication method for a dual multi-bit memory cell. It is to be understood that the above description is intended to be illustrative, and not restrictive. Those of skill in the art will recognize that the invention can be practiced with modification and alteration within the spirit and scope of the appended claims and many other embodiments will be apparent to those of skill in the art upon reading and understanding the above description. The procedures for formation, for example, the formation of shallow trench isolation areas, p-well, and n-well are similar to conventional CMOS processing and, although not shown or described, these processes or structures may be used with the invention described. Other processes such as the formation of oxides, polysilicon layers, or nitride layers may be performed by other processes not described but known to one of skill in the art. Masking processes with exposure, development, and vertical or horizontal etching of layers may be performed by a variety of processes including chemical etching or ion milling. The description is thus to be regarded as illustrative rather than limiting. The scope of the invention should, therefore, be determined with reference to the appended claims, along with the full scope of equivalents to which said claims are entitled.

What is claimed is:

1. A nonvolatile dual memory cell device comprising:
   a first nonvolatile memory cell structure having a nanocrystal gate;
   a second non-volatile memory cell structure having a nanocrystal gate;
   a single word line transistor coupled between said first and said second nonvolatile memory cell structures;
   said first and said second nonvolatile memory cell structures each having a nanocrystal gate; and
   said nanocrystal gates having a width that is smaller than an optical process photolithography resolution limit.

2. The nonvolatile dual memory cell device of claim 1 wherein said nanocrystal gate further comprises a nanocrystal layer, said nanocrystal layer having an approximate thickness between 20 Angstroms and 60 Angstroms.

3. The nonvolatile dual memory cell device of claim 1 wherein the region of said nanocrystal gate further comprises a tunnel oxide, a nanocrystal material, and a control oxide.

4. The nonvolatile dual memory cell device of claim 3 wherein the total summed average thickness of said tunnel oxide layer, said nanocrystal layer, and said control oxide layer is approximately 120 Angstroms to 180 Angstroms.

5. The nonvolatile dual memory cell device of claim 1 wherein each nonvolatile memory cell structure has the capacity to store multiple logic states.

6. A nonvolatile dual memory cell device comprising:
   a first nonvolatile memory cell structure having a nanocrystal gate;
   a second non-volatile memory cell structure having a nanocrystal gate;
   said first and said second nonvolatile memory cell structures each having a nanocrystal gate having a width that is smaller than an optical process photolithography resolution limit;
   said first and second nonvolatile memory cell structures each having a depleted area proximate to said nanocrystal gate, said depleted area and said nanocrystal gate configured to allow an injection of hot carriers from said depleted area to said nanocrystal gate thereby requiring less energy due to reduced carrier scattering;
   a pair of spaced apart bit lines on opposite sides of the dual memory cell device, each bit line providing one of a source and drain electrode for an adjacent non-volatile memory cell; and
   a single word line transistor interposed between the pair of spaced apart non-volatile memory cell structures, the word line transistor having a gate electrode communicating with another of the source and drain electrodes of the adjacent non-volatile memory cell structure.

7. A non-volatile dual memory cell for a memory array having word lines and bit lines comprising:

a pair of spaced apart non-volatile memory transistors built upon a semiconductor substrate, each having an electrode in the substrate, a nanocrystal floating gate and a control gate associated with a word line both situated upon the substrate, each nanocrystal floating gate having a width that is smaller than an optical process photolithography limit;

a pair of spaced apart bit lines built over a substrate, each bit line associated with one of the substrate electrodes of one of said pair of non-volatile memory transistor;

a single word line device interposed between the pair of spaced apart non-volatile memory transistors, the word line device having a pair of electrodes in the substrate with one substrate electrode connected to a substrate electrode of a non-volatile memory transistor that is not connected to a bit line.

8. The memory cell of claim 7 wherein said nanocrystals are selected from the group of silicon, germanium and Si—Ge.

9. The memory cell of claim 7 wherein said nanocrystals have area coverage ranging between 50% to 75%.

10. The memory cell of claim 7 wherein the nanocrystal floating gate has a nanocrystal layer sandwiched between a control oxide layer and a tunnel oxide layer.

11. The memory cell of claim 10 wherein the nanocrystal layer has a thickness in the range of 20–60 Angstroms.

12. The memory cell of claim 10 wherein the tunnel oxide layer has a thickness in the range of 20–60 Angstroms.

13. The memory cell of claim 10 wherein the control oxide layer has thickness in the range of 60–100 Angstroms.

14. The memory cell of claim 7 wherein the cell has a planar upper surface.

15. The memory cell of claim 7 wherein each control gate of each non-volatile memory transistor is a first polysilicon layer.

16. The memory cell of claim 15 wherein each bit line is a second polysilicon layer.

17. The memory cell of claim 16 wherein each word line device is associated with a third polysilicon member.

18. The memory cell of claim 7 wherein a plurality of identical memory cells as set forth in claim 7 are replicated in said memory array.

* * * * *